(12) United States Patent
Shields et al.

(10) Patent No.: US 6,177,355 B1
(45) Date of Patent: Jan. 23, 2001

(54) PAD ETCH PROCESS CAPABLE OF THICK TITANIUM NITRIDE ARC REMOVAL

(75) Inventors: Jeffrey A. Shields, Sunnyvale; Mark Anderson, Fremont, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/387,122

(22) Filed: Aug. 31, 1999

(51) Int. Cl.[7] ................................................ H01L 21/00
(52) U.S. Cl. ...................... 438/714; 438/612; 438/724; 438/757
(58) Field of Search ..................... 438/612, 714, 438/723, 715, 724, 725, 743, 744, 745, 756, 757; 216/67, 75, 102; 257/437, 459, 765

(56) References Cited

U.S. PATENT DOCUMENTS 5,700,737 * 12/1997 Yu et al. ........................... 438/724 X
5,930,664 *  7/1999 Hsu et al. ......................... 438/724 X

* cited by examiner

*Primary Examiner*—William Powell
(74) *Attorney, Agent, or Firm*—Foley & Lardner

(57) ABSTRACT

A method of pad etch which removes an anti-reflective coating over a conductor in an integrated circuit is disclosed herein. The method includes providing a mask layer, stabilizing the mask layer, and providing a high temperature etch to remove the anti-reflective coating.

20 Claims, 2 Drawing Sheets

PAD ETCH PROCESS CAPABLE OF THICK TITANIUM NITRIDE ARC REMOVAL

FIELD OF THE INVENTION

The present invention relates to integrated circuits and to methods of manufacturing integrated circuits. More particularly, the present invention relates to a pad etch process with thick titanium nitride (TiN) anti-reflective coating (arc) removal.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gate structures disposed between drain and source regions. The drain and source regions are typically heavily doped with a P-type dopant (boron) or an N-type dopant (phosphorous).

Structures of metal or other conductive materials can be included in ICs to interconnect transistors or make connections to transistors from other devices. For example, an IC can include several layers (metal 1, metal 2, etc.) of conductive lines, each being a composition of several metal materials. The conductive lines are insulated from each other by interlevel dielectric layers (ILD 1, ILD 2, etc). The last (uppermost) layer of conductive lines is covered by a final insulating material. In the fabrication process, this last conductive layer, or "topside stack", must be exposed at specific sites to make appropriate connections to the IC (a pad etch). Generally, the final insulating material is etched to expose portions of the top surface of the layer, or "pad", of the topside stack.

The conductive lines may be covered with a titanium nitride (TiN) anti-reflective coating (arc). A TiN arc on top of the conductive lines serves two purposes: 1) as an anti-reflective coating for lithography and 2) as a via etch stop. The final metal layer (the topside stack) typically is coated with thinner TiN since it only has to serve as an anti-reflective coating, not an etch stop. A thinner TiN is beneficial on the final metal layer because during a pad etch all of the TiN must be removed to ensure high quality bonding. In some instances, a thick TiN layer is necessary during pad etch for other reasons (e.g., yield issues, non-standard flows, pad opens for sample wafer electrical test during a process flow). With thicker TiN, it is necessary to remove additional TiN for high quality bonding.

One prior method of removing thick TiN is using increased temperature during the etching process. The TiN etch rate is a strong function of temperature. Allowing the wafer to reach temperatures greater than approximately 110° C. will accelerate the TiN etch rate. However, using such temperatures can damage the photoresist, making the photoresist very difficult to remove.

Thus, there is a need for a pad etch process for removing thick TiN under the topside stack. Further, there is a need for removing TiN at a much higher rate. Even further, there is a need for stabilizing the photoresist such that the photoresist can withstand elevated temperatures.

SUMMARY OF THE INVENTION

One embodiment of the present invention relates to a method of pad etching which removes an anti-reflective coating over a conductor in an integrated circuit. The method includes providing a mask layer, stabilizing the mask layer to high temperature, and providing a high temperature etch to remove the anti-reflective coating.

Another embodiment of the present invention relates to a method of removing an anti-reflective coating layer disposed over a stack structure under a topside stack. The method includes providing a photoresist layer including an aperture, stabilizing the photoresist layer to high temperature, and etching a hole below the aperture in the photoresist layer. The photoresist layer is located over a portion of an insulating layer disposed over the anti-reflective coating and the stack structure. The hole extends through the insulating layer and the anti-reflective coating layer.

Another embodiment of the present invention relates to an integrated circuit manufactured by the process of removing an anti-reflective coating. The process includes stabilizing a mask layer disposed over a dielectric layer and utilizing the stabilized mask layer to remove the anti-reflective coating in a high temperature process.

BRIEF DESCRIPTION OF THE DRAWINGS

Preferred exemplary embodiments are described below with reference to the accompanying drawings, wherein like reference numerals denote like elements, and.

DETAILED DESCRIPTION OF THE PREFERRED EMBODIMENTS

Figure 1:
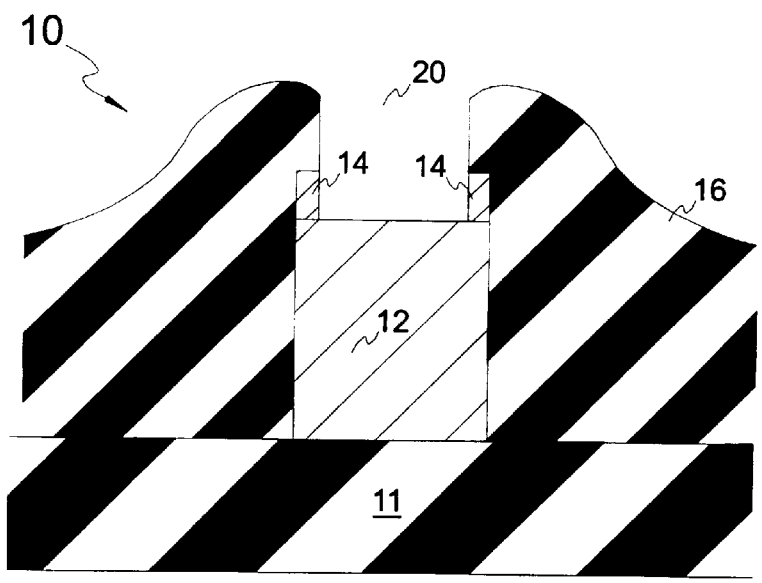
FIG. 1 is a cross-sectional view of a portion of an integrated circuit in accordance with an exemplary embodiment of the present invention.

Referring to FIG. 1, a cross-sectional view of a portion 10 of an integrated circuit is illustrated in accordance with an exemplary embodiment of the present invention. Portion 10 includes a final metal stack structure 12, an anti-reflective coating (arc) layer 14, a topside stack or insulating layer 16, and an interlevel delectric layer 11. Portion 10 of an integrated circuit is provided over a conductive layer which is provided over a substrate. Alternatively, portion 10 can be provided directly over a substrate which can be silicon or any semiconducting material.

Final metal stack structure 12 is a conductor, such as, aluminum or other metal formed over a substrate. Structure 12 can be a composition of various conductive materials, such as, tantalum (Ta), copper (Cu), aluminum (Al), titanium (Ti), tungsten (W), and compounds of copper, tantalum, aluminum, tungsten, nitrogen (N), and titanium. Arc layer 14 is an anti-reflective material, such as, titanium nitride (TiN) formed on top of final metal stack structure 12. Insulating layer 16 is a layer of an insulating material, such as, silicon dioxide.

Preferably, final metal stack structure 12 is 4,000–12,000 Å in height and approximately 120 microns in width. Arc layer 14 has a preferable thickness of 350–2,500 Å. Insulating layer 16 can be a single layer or a composite layer. In addition, layer 16 can be provided over a high temperature oxide layer. Layer 16 has a preferable thickness of 5,000 to 50,000 Å and is nitride or oxide material. Interlevel dielectric layer 11 has a preferable thickness of 4,000 to 10,000 Å and is oxide material.

Final metal stack structure 12 is exposed through an aperture 20. Aperture 20 extends through layer 16 and layer 14 and allows electrical contact to be made to structure 12. Aperture 12 is 100 microns wide (e.g., structure 12 and layer 14 are wider than aperture 20.

Figure 2:
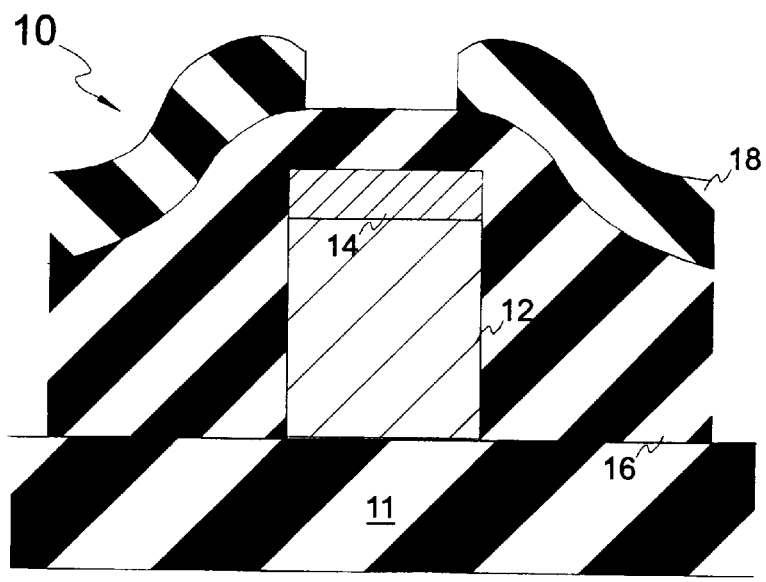
FIG. 2 is a cross-sectional view of the portion of the integrated circuit of FIG. 1, illustrating a deposition and stabilization step in a pad etch process with thick TiN removal in accordance with the present invention.

The method of forming portion 10 is described below with reference to FIGS. 1–3. The method advantageously forms portion 10 including a pad etch process with thick arc layer removal. In FIG. 2, a cross-sectional view of portion 10 illustrates a photoresist layer deposition and stabilization step. A photoresist layer 18, or mask layer, is deposited over insulating layer 16 to cover the selected area of insulating layer 16 which will not be etched. Photoresist layer 18 is patterned in a photolithographic process.

In an exemplary embodiment, ultra-violet (UV) baking stabilizes, or cures, the photoresist layer 18, or mask layer, deposited over insulating layer 16. Alternatively, other stabilization processes can be used to stabilize photoresist layer 18. UV-baking allows photoresist layer 18 to withstand elevated temperatures. Arc layer 14 is removed at a much higher rate at elevated temperatures. Preferably, portion 10 is subjected to ultra-violet baking in a chamber specifically designed for UV-baking which permits helium cooling and radio frequency (RF) heating.

In the exemplary embodiment, higher temperatures are achieved by turning off the backside helium cooling on the wafer. Backside helium acts like a gaseous thermal compound between the wafer and a lower deposition electrode, helping keep the wafer close to the electrode temperature (typically between −20° C. and 40° C.). Turning off the backside helium cooling allows the applied RF power to heat the wafer. Alternatively, other heating methods may be used to heat the wafer.

Figure 3:
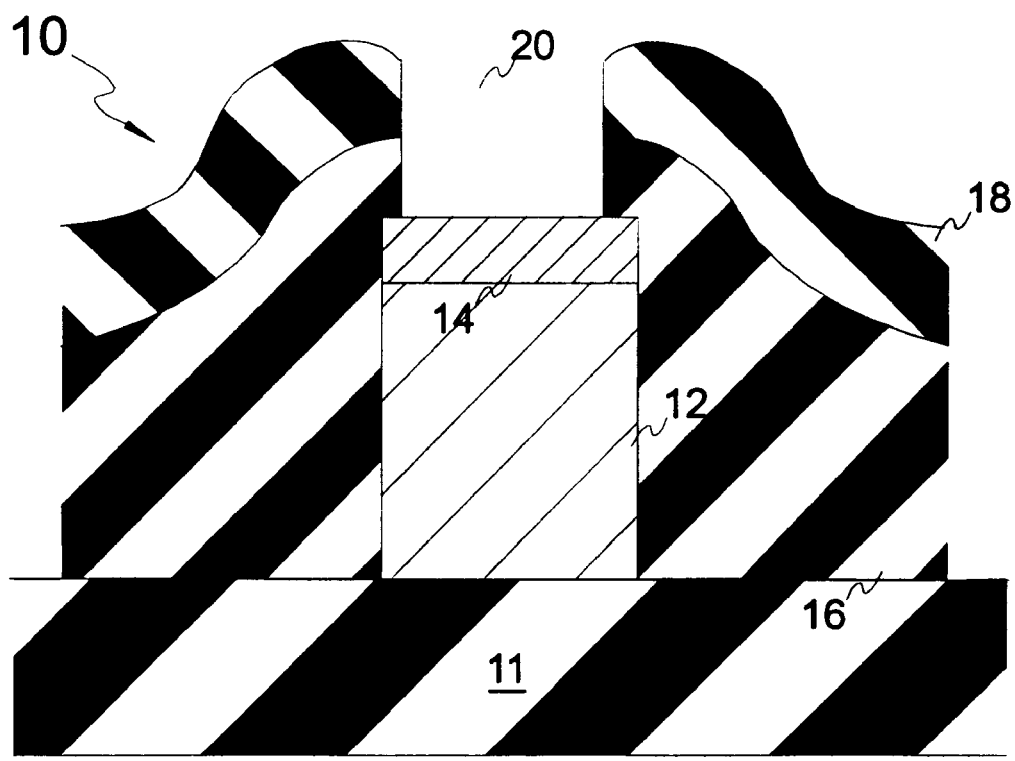
FIG. 3 is a cross-sectional view of the portion of the integrated circuit of FIG. 1, illustrating an etch step in a pad etch process with thick TiN removal.

In FIG. 3, a cross-sectional view of portion 10 illustrates an etch step of insulating layer 16. Dry etching or wet etching may be used to form an aperture 20 in insulating layer 16. Preferably, layer 16 is etched by a fluorine containing plasma. Alternatively, other removal processes may be used. Arc layer 14 is not completely removed by the etch step.

Referring now to FIG. 1, the cross-sectional view illustrates portion 10 including final metal stack structure 12 with a portion of arc layer 14 removed by etching. Advantageously, the pad etch method removes thick arc layer 14. Further, arc layer 14 is removed at a much higher rate due to elevated temperatures. The etching processes used can include fluorine containing plasmas, with gases such as $CF_4$, $SF_6$, $CHF_3$, or $NF_3$. Elevated temperatures can be used because photoresist layer 18 is stabilized to withstand elevated temperatures.

Conventional arc layer removal processes remove an arc layer with a width ranging from 350 to 750 Å. The method of forming portion 10 described with reference to FIGS. 1–3 provides for removal of arc layer 14 with a thickness ranging from 750 Å to 2500 Å. Advantageously, the method described doubles or triples the etch rate possible.

The method of forming portion 10 described with reference to FIGS. 1–3 includes separate etch processes for insulating layer 16 and arc layer 14. Alternatively, aperture 20 is created by one etching procedure which removes portions of insulating layer 16 and arc layer 14 in one step.

While the embodiments illustrated in the FIGURES and described above are presently preferred, it should be understood that these embodiments are offered by way of example only. Other embodiments may include, for example, different selective etching techniques. The invention is not limited to a particular embodiment, but extends to various modifications, combinations, and permutations that nevertheless fall within the scope and spirit of the appended claims.

What is claimed is:

1. A method of pad etch which removes an anti-reflective coating over a conductor in an integrated circuit, the method comprising:

providing a mask layer;

stabilizing the mask layer to high temperature; and providing a high temperature etch to remove the anti-reflective coating.

2. The method of claim 1, wherein the step of stabilizing the mask layer comprises baking the mask layer.

3. The method of claim 2, wherein baking the mask layer comprises using ultra-violet light.

4. The method of claim 1, wherein the anti-reflective coating has a thickness between 750 and 2500 Å.

5. The method of claim 1, wherein the step of providing a high temperature comprises turning off a backside helium cooling.

6. The method of claim 1, wherein the conductor forms a topside stack and wherein the anti-reflective coating comprises titanium nitride.

7. A method of removing an anti-reflective coating layer disposed over a stack structure, the method comprising:

providing a photoresist layer over a portion of an insulating layer disposed over the anti-reflective coating layer and the stack structure, the photoresist layer including an aperture;

stabilizing the photoresist layer to high temperature; and etching a hole below the aperture in the photoresist layer, the hole extending through the insulating layer and the anti-reflective coating layer.

8. The method of claim 7, wherein the step of stabilizing the photoresist layer comprises UV-baking the photoresist layer.

9. The method of claim 7, wherein the anti-reflective coating layer has a thickness between 2000 and 3000 Å.

10. The method of claim 7, wherein the step of etching the anti-reflective coating comprises providing a high temperature.

11. The method of claim 10, wherein providing a high temperature comprises turning off a backside helium cooling.

12. The method of claim 7, wherein the anti-reflective coating layer comprises titanium nitride (TiN).

13. An integrated circuit manufactured by the process of removing an anti-reflective coating, the process comprising:

stabilizing a mask layer disposed over a dielectric layer; and utilizing the stabilized mask layer to remove the anti-reflective coating in a high temperature process.

14. The integrated circuit of claim 13, wherein the step of stabilizing the mask layer comprises baking.

15. The integrated circuit of claim 13, wherein the anti-reflective coating has a thickness up to 3000 Å.

16. The integrated circuit of claim 13, wherein the process of removing a anti-reflective coating further comprises creating a hole in the portion of the dielectric layer located above the anti-reflective coating.

17. The integrated circuit of claim 13, wherein the anti-reflective coating is located on top of an aluminum structure serving as a topside stack.

18. The integrated circuit of claim 13, wherein the utilizing step comprises etching, the etching having a rate which increases with increasing temperature.

19. The integrated circuit of claim 18, wherein the anti-reflective coating comprises titanium nitride (TiN).

20. The integrated circuit of claim 18, wherein the etching rate is at least twice the rate possible without the stabilizing step.

* * * * *